(12) United States Patent
Yamauchi et al.

(10) Patent No.: US 8,901,422 B2
(45) Date of Patent: Dec. 2, 2014

(54) LID STRUCTURE FOR FLAT-CABLE INSERTION OPENING

(75) Inventors: Takashi Yamauchi, Hyogo (JP); Tomoya Fujita, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/322,218

(22) PCT Filed: Sep. 15, 2009

(86) PCT No.: PCT/JP2009/004609
§ 371 (c)(1),
(2), (4) Date: Nov. 23, 2011

(87) PCT Pub. No.: WO2011/033553
PCT Pub. Date: Mar. 24, 2011

(65) Prior Publication Data
US 2012/0060425 A1 Mar. 15, 2012

(51) Int. Cl.
*H02G 3/14* (2006.01)
*H02G 3/22* (2006.01)
*H05K 5/02* (2006.01)

(52) U.S. Cl.
CPC .............. *H02G 3/22* (2013.01); *H05K 5/0247* (2013.01)
USPC ....................................................... 174/67

(58) Field of Classification Search
CPC ......... H02G 3/14; H02G 15/07; H01R 13/447
USPC .............. 174/60, 66, 67, 72 A, 135; 220/241, 220/242; 439/136, 455, 457
See application file for complete search history.

(56) References Cited

U.S. PATENT DOCUMENTS

| | | | | |
|---|---|---|---|---|
| 4,928,901 A | * | 5/1990 | Bannai et al. | 242/396 |
| 4,984,982 A | * | 1/1991 | Brownlie et al. | 439/131 |
| 5,693,908 A | * | 12/1997 | Amberger | 174/656 |
| 6,070,307 A | * | 6/2000 | Kawanabe | 24/457 |
| 6,294,724 B1 | * | 9/2001 | Sasaoka et al. | 136/251 |
| 6,563,047 B2 | * | 5/2003 | Lambiaso | 174/50 |
| 6,835,890 B2 | * | 12/2004 | Dinh et al. | 174/66 |
| 6,942,501 B2 | * | 9/2005 | Kissinger et al. | 439/131 |
| 7,276,662 B2 | * | 10/2007 | Drane | 174/66 |
| 7,416,435 B2 | * | 8/2008 | Onogi | 439/445 |
| 7,459,632 B2 | * | 12/2008 | Bowman | 174/66 |
| 8,119,912 B2 | * | 2/2012 | Thibault et al. | 174/67 |
| 2008/0149364 A1 | | 6/2008 | Lutsch et al. | |

FOREIGN PATENT DOCUMENTS

| | | |
|---|---|---|
| DE | 102006028727 A1 | 1/2008 |
| JP | 64-37322 U | 3/1989 |
| JP | 9-167894 A | 6/1997 |
| JP | 2007-139999 A | 6/2007 |

\* cited by examiner

*Primary Examiner* — Boris Chervinsky
*Assistant Examiner* — Pete Lee
(74) *Attorney, Agent, or Firm* — Birch, Stewart, Kolasch & Birch, LLP

(57) ABSTRACT

A guide lug 3, lateral side temporarily fixing claws 4a, and slit side temporarily fixing claws 4b are hooked on a flat-cable insertion opening opened in a sheet metal casing to thereby temporarily fix a lid 1 with the lid half-opened. When the lid 1 in a half-opened state is adapted as a guide, a flat cable is inserted into a slit 5 from the inside of the casing and pulled out to the outside of the casing. The pulled out flat cable is pinched between a flange 8 of the lid 1 and the peripheral face of the flat-cable insertion opening to be screwed.

11 Claims, 4 Drawing Sheets

LID STRUCTURE FOR FLAT-CABLE INSERTION OPENING

TECHNICAL FIELD

The present invention relates to a lid structure for fixing a flat cable with filling a flat-cable insertion opening of a casing.

BACKGROUND ART

When a flat cable is inserted into an insertion opening of a sheet metal casing of design, a component serving as a lid is needed to prevent the mixing of foreign matter and enhance the appearance thereof. Conventionally, after a flat cable is inserted into an insertion opening of a sheet metal casing, a resin component serving as a lid is mounted to the insertion opening to fill the opening (for example, see Patent Document 1).

PRIOR ART DOCUMENTS

Patent Documents

Patent Document 1: JP-A-2007-139999

SUMMARY OF THE INVENTION

Since the conventional lid is arranged as discussed above, there is a problem such that during an insertion work of the flat cable and after an insertion of the flat cable therethrough, when the flat cable comes in contact with the edge of the sheet metal, the cable is damaged or broken.

In order to prevent the flat cable from being damaged or broken, it is necessary to subject the edge of the sheet metal to damage-preventing working (edge-rounding working using dies, bending working, or the like); however, the working leads to the complication of a die structure and an increase in the number of work steps, resulting in an increase of the production cost of dies and the unit cost of components.

The present invention has been made to solve the above-discussed problems, and an object of the invention is to provide a lid structure for a flat-cable insertion opening that can protect the flat cable from the edge of the sheet metal during the work and after the mounting of the lid to thus prevent the damage and break thereof.

A lid structure of a flat-cable insertion opening of the invention has a lid attached to the flat-cable insertion opening, wherein the lid includes: a protective rib which fits in the flat-cable insertion opening to surround an edge thereof; a temporarily fixing claw which temporarily fixes the lid to the flat-cable insertion opening with the lid half-opened such that the insertion of a flat cable is guided, and which is provided on the protective rib and hooked on the edge; and a slit which is drilled in the protective rib, and into which the flat cable is inserted.

According to the invention, it is arranged that the edge of the flat-cable insertion opening is surrounded by the protective rib, and that the flat cable is inserted into the slit under the condition where the lid is temporarily fixed to the flat-cable insertion opening with the lid half-opened by means of the temporarily fixing claw; thus, the lid structure of the flat-cable insertion opening can be provided such that the flat cable can be protected from the edge to prevent the damage and break thereof, during an insertion work of the flat cable with the lid half-opened and after the lid is attached thereto to fill the flat-cable insertion opening into which the flat cable is inserted.

BEST MODE FOR CARRYING OUT THE INVENTION

Embodiments of the present invention will now be described with reference to the accompanying drawings to explain the present invention in more detail.

First Embodiment

Figure 1:
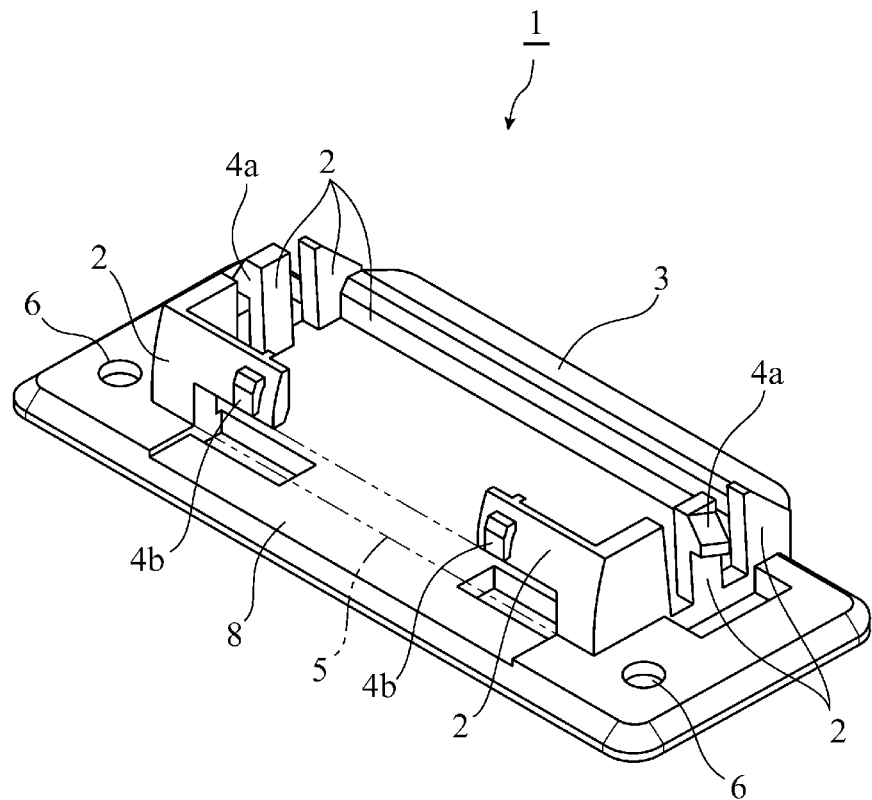
FIG. 1 is a perspective view showing an arrangement on the back side of a lid 1 of a first embodiment of the present invention.
Figure 2:
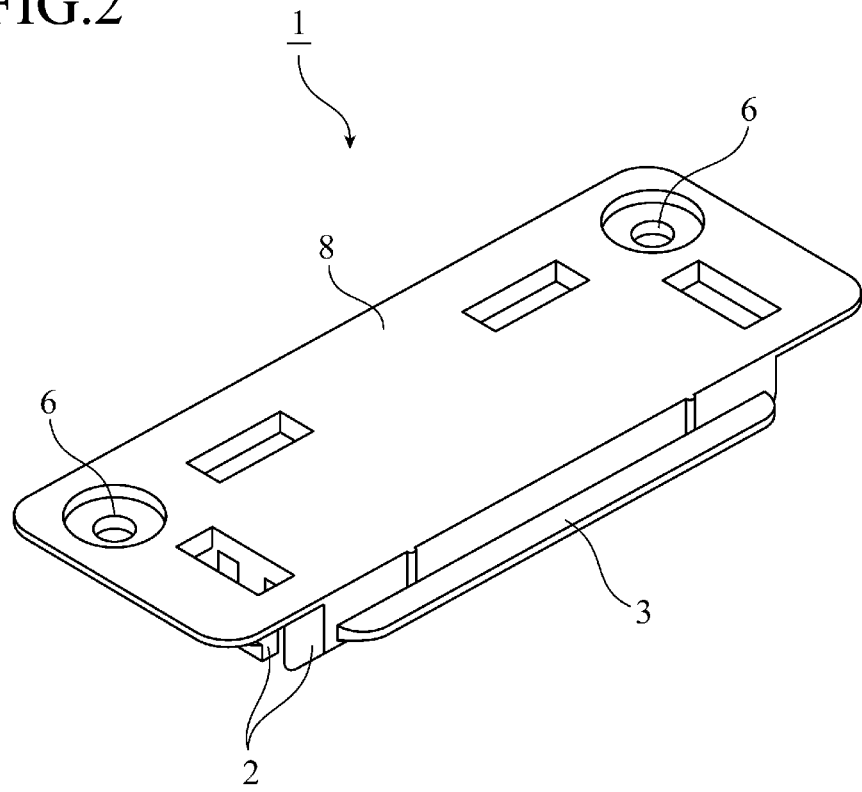
FIG. 2 is a perspective view showing an arrangement on the front side of the lid 1 shown in FIG. 1.
Figure 3:
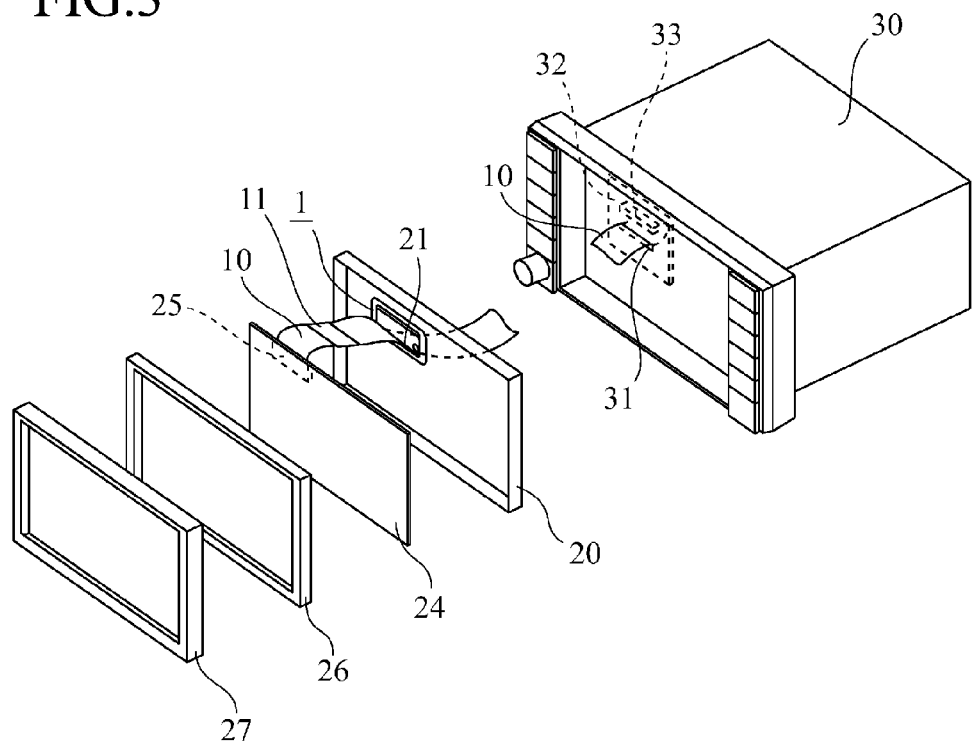
FIG. 3 is an exploded perspective view showing a whole arrangement of an in-vehicle audio equipment to which the lid 1 of the first embodiment is attached.

FIG. 1 shows an arrangement on the back side of a lid 1 of a first embodiment of the present invention, and FIG. 2 shows an arrangement on the front side thereof. FIG. 3 is an exploded perspective view showing a whole arrangement of an in-vehicle audio equipment to which the lid 1 in FIGS. 1 and 2 is applied, by way of example. In the in-vehicle audio equipment shown in FIG. 3, a flat-cable insertion opening 31 is drilled in a main body casing 30, and one end of the flat cable 10 is pulled in the casing through the opening to be attached to a connector 33 of a board 32. The other end of the flat cable 10 is attached to a connector 25 provided on a board 24 for controlling the operation of a liquid crystal panel 26. Since a liquid crystal casing (sheet metal casing) 20 to which a frame 27 is mounted with the board 24 and the liquid crystal panel 26 housed inside is arranged to be movable to the main body casing 30, the liquid crystal casing 20 is externally exposed depending on use conditions. Therefore, in order to prevent foreign matter from entering through a flat-cable insertion opening 21 of the liquid crystal casing 20 and enhance the appearance thereof, the flat-cable insertion opening 21 is filled with the lid 1 of a resin component. Note that for convenience in explanation, the side of the liquid crystal casing 20 facing the main body casing 30 is referred to as a "front side," and the side thereof housing the board 24 and so on is referred to as a "back side"; the sides of the lid 1 are referred to as front and back sides in a similar manner.

As shown in FIG. 1 and FIG. 2, a protective rib 2 which fits in the flat-cable insertion opening 21 to surround the edge of the flat-cable insertion opening 21 is protrusively provided on the back side of the lid 1. A guide lug 3 which is hooked on the edge of the flat-cable insertion opening 21, and further lateral side temporarily fixing claws 4a which are hooked on the edge upon a temporary fixation (discussed later) and slit side temporarily fixing claws 4b are formed on the protective rib 2. Also, the side of the protective rib 2 opposite to the guide lug 3 is opened; such an opened portion serves as a slit 5 for inserting the flat cable 10 thereinto. The lateral width of the slit 5 is adapted to that of the flat cable 10. A flange 8 is formed around the peripheral edge of the lid 1. A screw fixing hole 6 for screw-fixing the lid 1 to the liquid crystal casing 20 is drilled on the flange 8.

Next, the temporary fixation of the lid 1 will be described.

Figure 4:
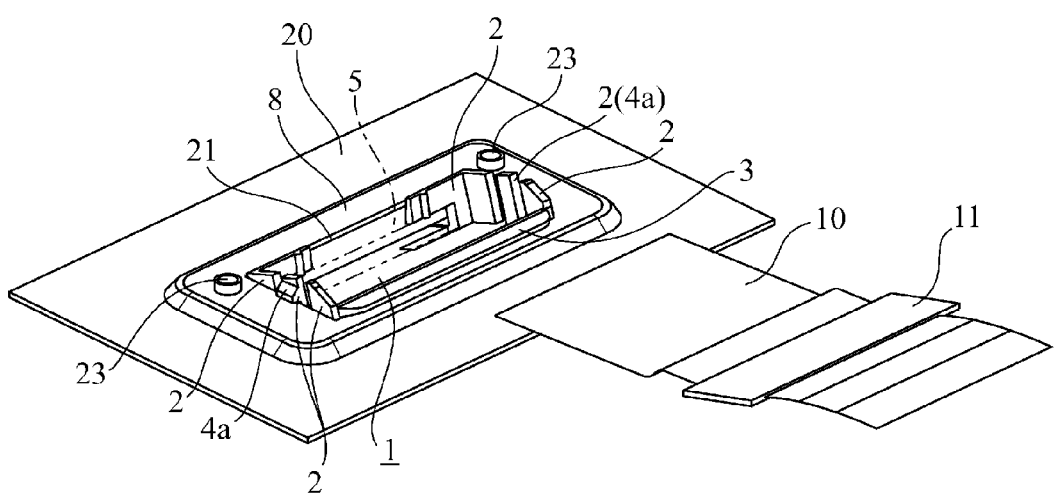
FIG. 4 is a perspective view showing an arrangement on the back side of the position where the lid 1 of the first embodiment is temporarily fixed to a flat-cable insertion opening 21.
Figure 5:
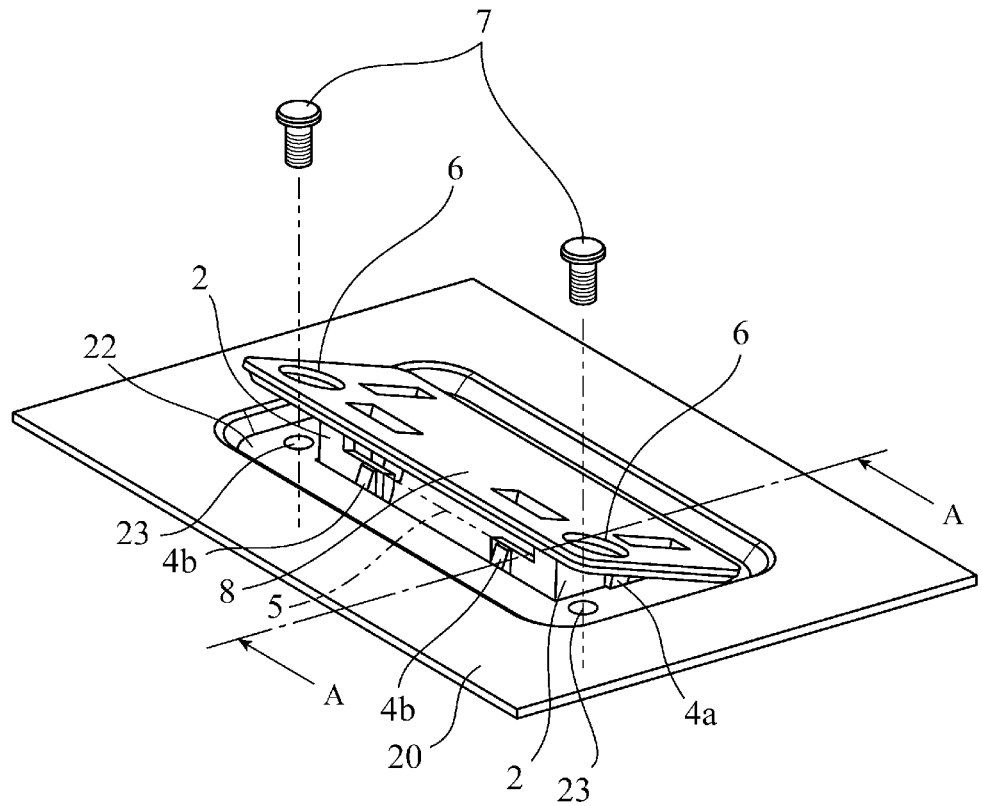
FIG. 5 is a perspective view showing an arrangement on the front side of the lid 1 shown in FIG. 4.
Figure 6:
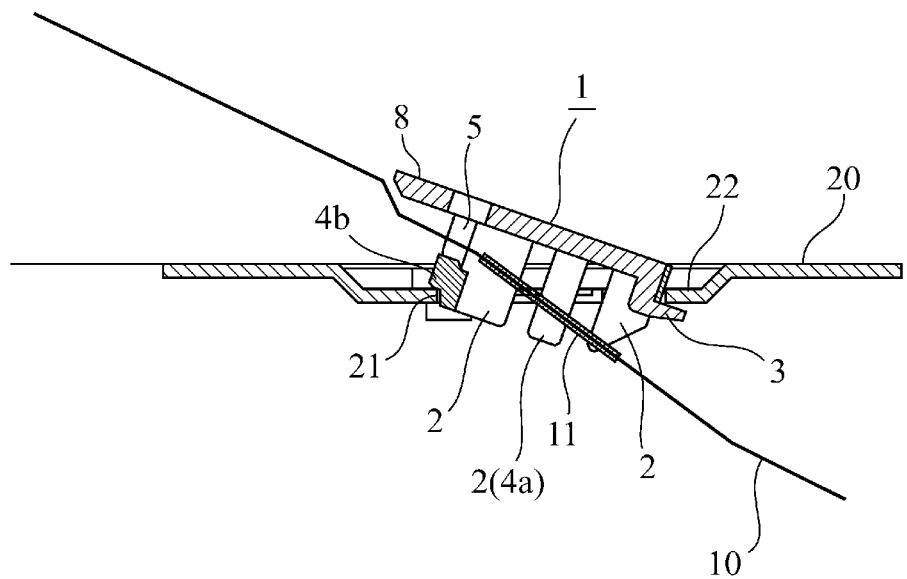
FIG. 6 is a sectional view of the lid 1 shown in FIG. 5 taken along the line A-A.

FIG. 4 is a perspective view showing an arrangement on the back side of the lid 1 in the position temporarily fixed to the flat-cable insertion opening 21, and FIG. 5 shows an arrangement on the front side thereof in the position. Also, FIG. 6 is a sectional view of the lid 1 shown in FIG. 5 taken along the line A-A, and an inserted position of the flat cable 10. A concavity 22 of substantially the same size as that of the flange 8 of the lid 1 is formed around the peripheral edge of the flat-cable insertion opening 21 of the liquid crystal casing 20. In addition, threaded holes 23 are drilled in the positions of the liquid crystal casing 20 corresponding to the screw fixing holes 6 of the lid 1, on the cavity 22.

When the rib 2 of the lid 1 is inserted into the flat-cable insertion opening 21 from the front side of the liquid crystal casing 20, the guide lug 3 is hooked on one side of the opening on the back side of the edge. Under such a condition, when the lid 1 is pressed, the lateral side temporarily fixing claws 4a are hooked on the right and left sides thereof on the back side of the edge, respectively, and the two slit side temporarily fixing claws 4b each are hooked on one side thereof on the front side of the edge. In such a way, when the guide lug 3, the lateral side temporarily fixing claws 4a, and the slit side temporarily fixing claws 4b of the lid 1 each are hooked on the edge of the flat-cable insertion opening 21, the lid 1 is temporarily fixed thereto in a half-opened position where the slit 5 is floated from the flat-cable insertion opening 21. Note that the lateral side temporarily fixing claws 4a are formed obliquely corresponding to the angle of the lid 1 that is half-opened in the temporarily fixed position.

The back face of the half-opened, temporarily fixed lid 1 that is inclined to the liquid crystal casing 20 serves as a guide during an insertion work of the flat cable 10. The flat cable 10 is inserted into the slit 5 from the back side of the liquid crystal casing 20, that is, from the direction of the guide lug 2 on the back side of the lid 1 that is in the temporarily fixed position, and pulled out on the front side of the liquid crystal casing 20. During the insertion work of the flat cable, the edge of the flat-cable insertion opening 21 is surrounded by the protective rib 2 of the lid 1, and thus the flat cable 10 is protected from the edge. In such a way, workers can work during the insertion of the flat cable 10 without giving attention to the edge of the flat-cable insertion opening 21, which enables an enhancement in assembly workability thereof.

Next, the fixation of the lid 1 will be described.

Figure 7:
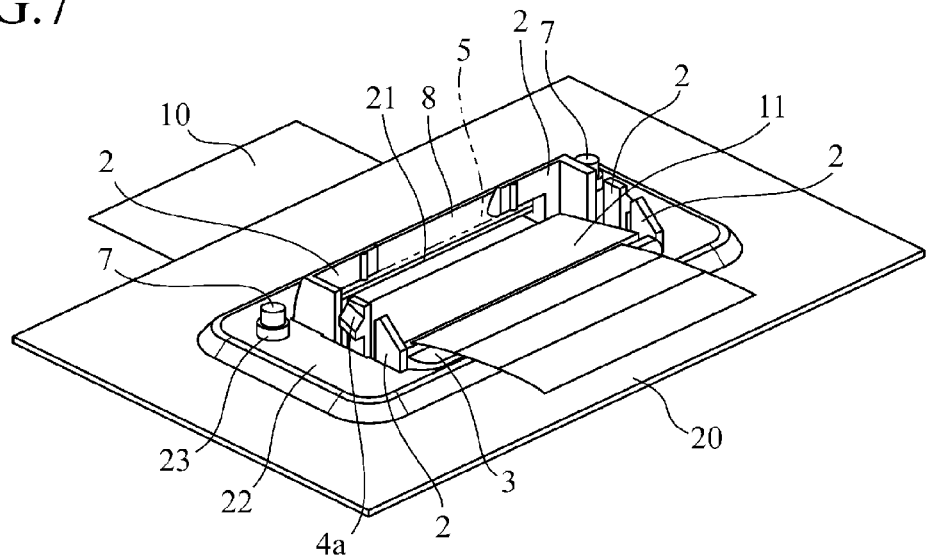
FIG. 7 is a perspective view showing an arrangement on the back side of the position where the lid 1 of the first embodiment is fixed to the flat-cable insertion opening 21.
Figure 8:
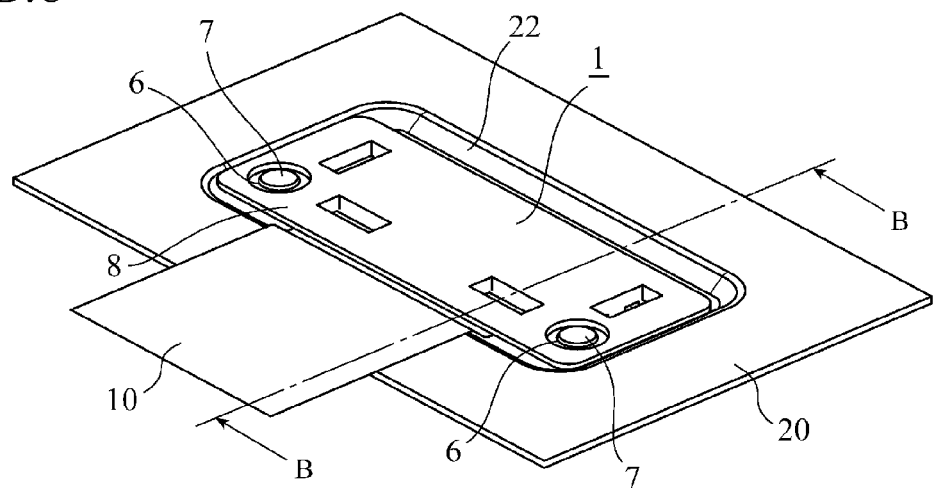
FIG. 8 is a perspective view showing an arrangement on the front side of the lid 1 shown in FIG. 7.
Figure 9:
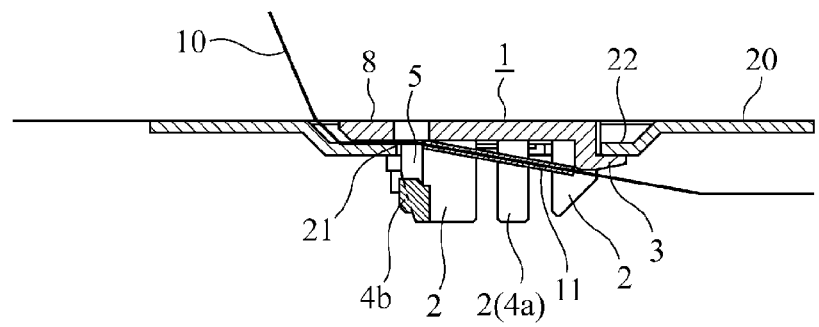
FIG. 9 is a sectional view of the lid 1 shown in FIG. 8 taken along the line B-B.

FIG. 7 is a perspective view showing an arrangement on the back side of the lid 1 in the position fixed to the flat-cable insertion opening 21, and FIG. 8 shows an arrangement on the front side thereof in the position. Further, FIG. 9 is a sectional view of the lid 1 shown in FIG. 8 taken along the line B-B.

When the lid 1 in the temporarily fixing position is further pressed, the slit side temporarily fixing claws 4b are resiliently deformed to is displaced on the back side of the flat-cable insertion opening 21, thus bringing the lid 1 to a closed position. Under such a condition, the screw fixing hole 6 of the lid 1 is fastened to the threaded hole 23 of the liquid crystal casing 20 by the screw 7 to thus mount the lid 1 to the flat-cable insertion opening 21. Then, the flat cable 10 is pinched between the flange 8 of the lid 1 and the concavity 22 of the liquid crystal casing 20 to be fixed. Hereupon, the concavity 22 does not have to be prepared; when the concavity is nevertheless prepared, the lid 1 is fit in the concavity 22 to thereby prevent the lid from protruding on the surface of the liquid crystal casing 20, thus preventing the design from being damaged.

Even after the lid 1 is secured to the liquid crystal casing 20, as in the case of the temporary fixation, the edge of the flat-cable insertion opening 21 is surrounded by the protective rib 2; thus, no flat cable 10 comes into contact with the edge of the flat-cable insertion opening 21. Therefore, the break of the flat cable due to the damage can be prevented, which contributes to an enhancement in reliability of the connective function with the connectors 25, 33. Furthermore, even in the case where the flat cable 10 is under a tension, since the flat cable is pinched between the lid 1 and the liquid crystal casing 20, a force is not transmitted directly to the connection section between the flat cable and the connectors 25, 33, which contributes to prevention of disconnection of the flat cable. In this context, in the first embodiment, the protective rib 2 is configured to have a disconnection at the upper portion of the slit 5 (between the slit side temporarily fixing claws 4b), and thus the edge of the flat-cable insertion opening 21 is not surrounded by the protective rib 2 in the portion. However, in the temporary fixation, the flat cable 10 is held in the position where the flat cable 10 is forced upwardly from the edge of the flat-cable insertion opening 21 by the protective rib 2 on which the slit side temporarily fixing claws 4b are provided, so that no cable comes into contact with the edge. Moreover, after the fixation, even if the flat cable 10 is bent, the cable abuts against the protective rib 2 on which the slit side temporarily fixing claws 4b are provided, so that no cable is damaged by the edge. Note that it may be arranged that the disconnected portion of the protective rib 2 are connected to surround the entire perimeter of the edge of the flat-cable insertion opening 21.

Moreover, the width of the slit 5 is formed to be substantially the same as that of the flat cable 10; thus, when a stopper 11 having a larger width is attached to the flat cable 10 to form a tab configuration, the stopper 11 is hooked on both the edges of the slit 5 of the lid 1 as shown in FIG. 7. In such a way, when the tab configuration is formed on the flat cable 10, the movement of the flat cable 10 is restrained even when an excessive load is applied thereon, thereby preventing the disconnection of the cable from the connectors 25, 33.

As described above, according to the first embodiment, the lid structure is arranged to have the lid 1 attached to the flat-cable insertion opening 21 opened in the liquid crystal casing 20 made of sheet metal, wherein the lid includes: the protective rib 2 which fits in the flat-cable insertion opening 21 to surround an edge thereof; the lateral side temporarily fixing claws 4a and the slit side temporarily fixing claws 4b which temporarily fix the lid 1 to the flat-cable insertion opening 21 with the lid 1 half-opened such that the insertion of the flat cable 10 is guided, and which are provided on the protective rib 2 and hooked on the edge; and the slit 5 which is drilled in the protective rib 2, and into which the flat cable 10 is inserted. For this reason, the flat cable 10 can be protected from the edge of the flat-cable insertion opening 21, during the insertion work in which the flat cable 10 is inserted thereinto with the lid 1 temporarily fixed in a half-opened state, and after the lid 1 is secured thereto to fill the flat-cable insertion opening 21 into which the flat cable 10 is inserted. Therefore, the breakage of the flat cable 10 due to the damage can be prevented.

Further, the lid structure is arranged to include the screws 7 for fixing the lid 1 to the liquid crystal casing 20, wherein the lid 1 has the flange 8 that is provided to the exterior of the protective rib 2, such that the flat cable 10 inserted into the slit 5 is pinched between the flange and the concavity 22 formed in the peripheral face of the flat-cable insertion opening 21. Therefore, a screwing is made in the position where the flat cable 10 is pinched between the flange 8 of the lid 1 and the peripheral face of the flat-cable insertion opening 21, thus fixing the flat cable 10. Thereby, the flat cables 10 can be prevented from being disconnected from the connectors 25, 33.

Besides, the lid structure is configured to include the flat cable 10 to which the stopper 11 hooked on the edge of the slit 5 of the lid 1 is attached to form the tab configuration. On this account, even when an excessive load is applied to the flat cable 10, the stopper 11 is hooked on the edge of the slit 5, thus preventing the flat cable from being disconnected from the connectors 25, 33.

Incidentally, in the first embodiment, the structure in which the lid structure is attached to the flat-cable insertion opening of the sheet metal casing is discussed by way of example; however, it is needless to say that the lid structure can be also attached to a casing different from the sheet metal casing.

INDUSTRIAL APPLICABILITY

As discussed above, since the lid structure of the flat-cable insertion opening of the present invention is arranged such that the protective rib provided with the temporarily fixing claws for temporarily fixing the lid with the lid half-opened surrounds the edge of the flat-cable insertion opening to thereby prevent the damage and break thereof, it is suitable for use in the lid structure for filling the flat-cable insertion opening of the sheet metal casing with the flat cable fixed.

The invention claimed is:

1. A system including a lid structure for a flat-cable insertion opening opened in a casing, the structure having a lid attached to the flat-cable insertion opening, wherein the lid comprises:
   a protective rib integrally formed with the lid and fitting in the flat-cable insertion opening to surround an edge thereof;
   a temporarily fixing claw which temporarily fixes the lid to the flat-cable insertion opening with the lid half-opened such that the insertion of a flat cable is guided, and which is provided on the protective rib and engages with the edge, the temporarily fixing claw protruding from the protective rib;
   a slit which is drilled in the protective rib, and into which the flat cable is inserted; and
   a stopper attached to the flat cable to form a tab configuration, the stopper having a larger width than the slit,
   wherein
      the temporarily fixing claw engages with the edge of the flat-cable insertion opening by resting only on a top surface and a side surface of the edge on the side of the casing facing the lid, when the lid is to be fixed half-opened to the flat-cable insertion opening, and
      the temporarily fixing claw disengages from the edge of the insertion opening in order to bring the lid to a closed position over the flat-cable insertion opening and the inserted flat-cable.

2. The system including the lid structure for the flat-cable insertion opening according to claim 1, further including a screw for fixing the lid to the casing, wherein the lid includes a flange which is provided to the outside of the protective rib such that the flat cable inserted into the slit is pinched between the flange and an edge face of the flat-cable insertion opening.

3. The system including the lid structure for the flat-cable insertion opening according to claim 1, wherein the flat cable has a tab configuration to be hooked on the edge of the slit of the lid.

4. The system including the lid structure for the flat-cable insertion opening according to claim 1, further comprising a screw hole for fixing the lid to the casing via a screw when the lid is in the closed position.

5. The system including the lid structure for the flat-cable insertion opening according to claim 1, wherein the temporarily fixing claw is made of resilient material.

6. A lid structure for a flat-cable insertion opening opened in a casing, the structure having a lid attached to the flat-cable insertion opening, wherein the lid comprises:
   a protective rib integrally formed with the lid and fitting in the flat-cable insertion opening to surround an edge thereof;
   a temporarily fixing claw made of a resilient resin-based material which temporarily fixes the lid to the flat-cable insertion opening with the lid half-opened such that the insertion of a flat cable is guided, and which is provided on the protective rib and engages with the edge, the temporarily fixing claw protruding from the protective rib; and
   a slit which is drilled in the protective rib, and into which the flat cable is inserted,
   wherein
      the temporarily fixing claw engages with the edge of the flat-cable insertion opening by resting only on a top surface and a side surface of the edge on the side of the casing facing the lid, when the lid is to be fixed half-opened to the flat-cable insertion opening, and
      the temporarily fixing claw resiliently deforms when the lid is pressed down to disengage from the edge of the insertion opening in order to bring the lid to a closed position over the flat-cable insertion opening and the inserted flat-cable.

7. A lid structure for a flat-cable insertion opening opened in a casing, the structure having a lid attached to the flat-cable insertion opening, wherein the lid comprises:
   a protective rib integrally formed with the lid and fitting in the flat-cable insertion opening to surround an edge thereof;
   a temporarily fixing claw which temporarily fixes the lid to the flat-cable insertion opening with the lid half-opened such that the insertion of a flat cable is guided, and which is provided on the protective rib and engages with the edge, the temporarily fixing claw protruding from the protective rib; and
   a slit which is drilled in the protective rib, and into which the flat cable is inserted,
   wherein
      the temporarily fixing claw engages with the edge of the flat-cable insertion opening by resting only on a top surface and a side surface of the edge on the side of the casing facing the lid, when the lid is to be fixed half-opened to the flat-cable insertion opening, and
      the temporarily fixing claw disengages from the insertion opening in order to bring the lid to a closed position over the flat-cable insertion opening and the inserted flat-cable, and wherein, when the lid is fixed half opened with the insertion cable being guided through the slit, the protective rib is disposed between the flat cable and each edge of the flat-cable insertion opening thus preventing the flat cable from coming in contact with any of the edges of the flat-cable insertion opening.

8. The system including the lid structure for the flat-cable insertion opening according to claim 1, wherein the lid includes a guide lug which hooks onto the edge of the insertion opening in such manner that the lid rotates relative to the portion of the edge hooked by the guide lug when transitioning from the half-opened position to the closed position.

9. The lid structure for the flat-cable insertion opening according to claim 6, wherein the lid includes a guide lug which hooks onto the edge of the insertion opening in such manner that the lid rotates relative to the portion of the edge hooked by the guide lug when transitioning from the half-opened position to the closed position.

10. The lid structure for the flat-cable insertion opening according to claim 7, wherein the lid includes a guide lug which hooks onto the edge of the insertion opening in such manner that the lid rotates relative to the portion of the edge hooked by the guide lug when transitioning from the half-opened position to the closed position.

11. The lid structure for the flat-cable insertion opening according to claim 6, wherein the temporarily fixing claw is made of resilient material.

* * * * *